United States Patent
Ikuta et al.

(10) Patent No.: US 8,625,649 B2
(45) Date of Patent: Jan. 7, 2014

(54) SURFACE EMITTING LASER AND IMAGE FORMING APPARATUS

(75) Inventors: Mitsuhiro Ikuta, Cambridge, MA (US); Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/413,910

(22) Filed: Mar. 7, 2012

(65) Prior Publication Data

US 2012/0237261 A1    Sep. 20, 2012

(30) Foreign Application Priority Data

Mar. 16, 2011    (JP) ................. 2011-058124

(51) Int. Cl.
*H01S 5/00* (2006.01)
*H01S 3/20* (2006.01)

(52) U.S. Cl.
USPC ..................................... 372/50.124; 382/54

(58) Field of Classification Search
USPC ........................ 372/50.124, 19, 54
See application file for complete search history.

(56) References Cited

U.S. PATENT DOCUMENTS

| | | | | |
|---|---|---|---|---|
| 2005/0265412 | A1* | 12/2005 | Ueki | 372/43.01 |
| 2008/0298416 | A1* | 12/2008 | Chirovsky et al. | 372/50.11 |
| 2010/0328747 | A1* | 12/2010 | Jikutani et al. | 359/205.1 |

FOREIGN PATENT DOCUMENTS

JP    2001-284722 A    10/2001

* cited by examiner

*Primary Examiner* — Armando Rodriguez
(74) *Attorney, Agent, or Firm* — Canon U.S.A., Inc. IP Division

(57) ABSTRACT

A surface emitting laser includes a stepped structure having a step between a first region and a second region, the stepped structure provided in an emission area located in an upper portion of the upper mirror. The surface emitting laser includes a light shielding member provided in a third region between the first region and the second region. The light shielding member is not provided in a portion of the first region and a portion of the second region.

12 Claims, 6 Drawing Sheets

SURFACE EMITTING LASER AND IMAGE FORMING APPARATUS

BACKGROUND OF THE INVENTION

1. Field of the Invention

Embodiments of the present invention relate to a surface emitting laser and an image forming apparatus including the surface emitting laser.

2. Description of the Related Art

Vertical-cavity surface emitting lasers (VCSEL) are used as light sources of exposure optical systems included in electrophotographic image forming apparatuses.

In order to improve the performance of the surface emitting laser, the surface emitting laser having a stepped structure provided on an emitting surface and in an emission area has been developed.

For instance, in order to accomplish laser oscillation in single transverse mode, JP No. 2001-284722 A discloses a surface emitting laser having a stepped structure provided in its surface so that a reflectivity of a center portion is higher than that of a peripheral portion in an upper mirror.

Moreover, Japanese Patent Laid-Open No. 2001-284722 discloses a method forming the stepped structure by etching process or liftoff process.

When the stepped structure is provided on an emitting surface and in an emission area, a distribution of electric-field amplitude in a near field is modulated. Thus, a distribution of electric-field amplitude in a far field is also modulated. As a result, a distribution of an intensity in the far field (FFP: Far Field Pattern) is also modulated.

When a protective film is not formed on the stepped structure, a boundary between the stepped structure and air may be referred to as a lateral face. The lateral face may be called edge portion. A lateral face of the stepped structure is not always perpendicular. The lateral face may have some angular degree and the stepped structure may have a tapered shape.

The angular degree depends on how to manufacture it, but in general, controlling the angular degree is more difficult than that of a film thickness. Thus, it is difficult to make the FFP a predetermined value because a shape of the stepped structure may be varied.

SUMMARY OF THE INVENTION

Accordingly, one disclosed aspect of the embodiments provides a surface emitting laser that may control the effect of the variation of the stepped structure shape in the process, and an image forming apparatus including the surface emitting laser.

According to an aspect of the embodiments, a surface emitting laser operating (e.g., oscillating) at a wave length $\lambda$ includes a substrate; a stacked structure provided on the substrate, the stacked structure including a bottom mirror, an active layer, and an upper mirror; a stepped structure having a step between a first region and a second region, the stepped structure provided in an emission area located in an upper portion of the upper mirror; and a light shielding member provided in a third region between the first region and the second region and not provided in a portion of the first region and a portion of the second region. Regarding an optical path length from a standard surface set on the outside of the surface emitting laser and extending perpendicular to a stacking direction of the stacked structure to an upper boundary surface of the upper mirror, the optical path length of the first region is different from the optical path length of the second region.

Further features of the embodiments will become apparent from the following description of exemplary embodiments.

DESCRIPTION OF THE EMBODIMENTS

First Embodiment

The reason why the FFP is varied due to the stepped structure is because an inclined angle in the edge portion of the stepped structure is easily varied and a laser light through the area having the inclined angle affects FFP. Thus, when the laser light is not transmitted through the area having the edge portion of the stepped structure, the effect of the variation in the shape of the stepped structure may be controlled.

Accordingly, one aspect of the embodiments has a light shielding member provided in the area having the edge portion where the inclined angle of the stepped structure may be varied.

Figure 1:
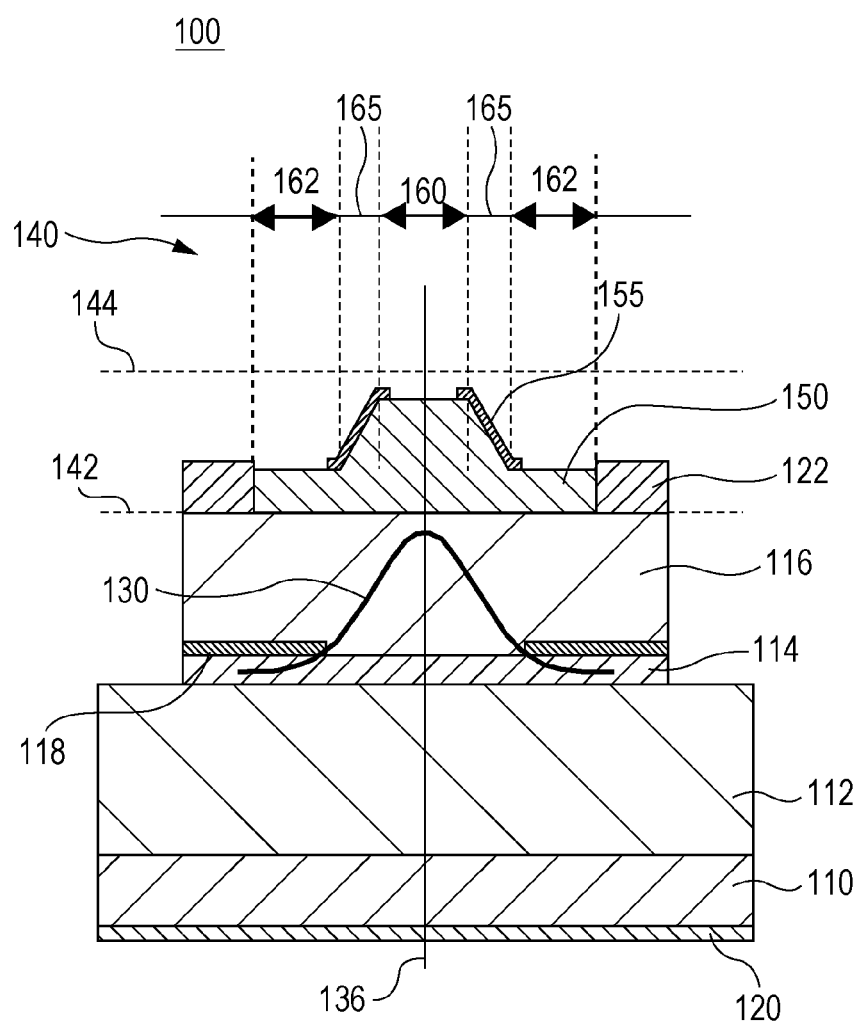
FIG. 1 is a diagram illustrating a sectional view of a surface emitting laser according to a first embodiment.

FIG. 1 is a sectional view of a surface emitting laser 100 according to an embodiment. The surface emitting laser 100 has a stacked structure including a bottom mirror 112, an active layer 114, and an upper mirror 116. These are provided on a semiconductor substrate 110. A cylindrical mesa structure is formed by etching a portion of upper mirror 116 and a bottom mirror 112.

A current confinement structure 118 provided in the upper mirror 116 has an insulating region so as to limit a current. For example, the insulating region is manufactured by introducing the water vapor from a lateral side of the mesa structure and oxidizing a semiconductor layer.

The current confinement structure 118 has a semiconductor region and an insulating region. The insulating region has lower refractive index than that of the semiconductor region so it defines an oscillation mode 130 and an emitting region.

An upper electrode 122 and a bottom electrode 120 for injecting current to the active layer 114 are provided on the upper mirror 116 and the back side of the substrate 120, respectively.

A stepped structure 150 having convex shape is provided on the upper mirror 116 as shown in FIG. 1. An optical thickness of the stepped structure 150 is different between a first region 160 and a second region 162. The stepped structure 150 is provided in an emission area which emits light.

In FIG. 1, the second region 162 is provided far from the first region 160 with respect to a center of the emission area. A third region 165 is located between the first region 160 and the second region 162.

As the stepped structure 150 is configured as above, a reflectivity and the FFP may be controlled.

FIG. 1 shows the stepped structure having convex shape as example, but the present invention may apply to a stepped structure having concavity shape.

Figure 2:
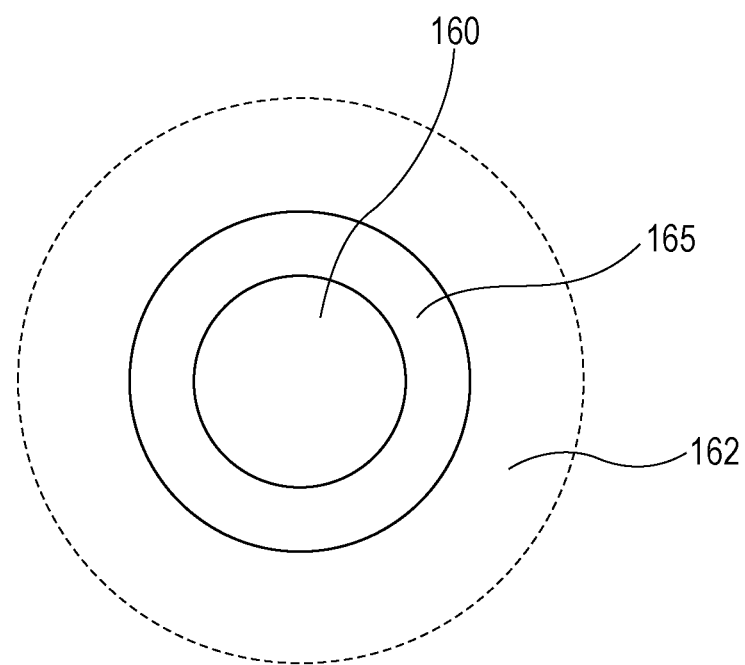
FIG. 2 a diagram illustrating a top view of the first, second, and third regions in the surface emitting laser according to a first embodiment.

FIG. 2 is a top view of the first region 160, the second region 162, and the third region 165 in the surface emitting laser 100. Each of lasers emits from each of these regions. The lasers interfere with each other so the FFP is formed.

Regarding an optical path length from the an upper boundary surface 142 of the upper mirror 116 to a standard surface 144, the optical path length varies between the first region 160 and the second region 162. As the optical thickness of the stepped structure 150 varies between the first region 160 and the second region 162, the optical path length from the upper boundary 142 to the standard surface 144 also varies between the first region 160 and the second region 162.

Here, the standard surface 144 indicates an imaginary surface set on the outside of the surface emitting laser, which is perpendicular to a stacking direction of the stacked structure.

An environmental medium 140 shown in FIG. 1 is air.

When a difference L between the optical length of the first region 160 and the optical length of the second region 162 satisfies the expression $(N+¼)\lambda < L < (N+¾)\lambda$ (N is an integer), the FFP may be controlled. For instance, the stepped structure 150 may make an angle of the FFP to spread or make a shape of the FFP to be flat around the center of the FFP. For example, L may be $\lambda/2$.

In the third region 165 which is provided between the first region 160 and the second region 162, the edge of the stepped structure 150 may be inclined.

In the third region 165, the light shielding member 155 is provided on the stepped structure 150. The light shielding member 155 does not allow the light from the inclined edge of the stepped structure 150 to affect the FFP.

That is, the light shielding member 155 may control the variation of the FFP when the tapered shape of the stepped structure has been varied in the manufacture process.

In order to diminish the influence on the FFP due to the error in manufacturing the stepped structure 150, the light shielding member 155 may be provided on all of the third region 165 including the edge portion of the stepped structure.

Even though the light shielding member 155 is provided in a part of the third region 165, the variation of the FFP may be diminished. Thus, one embodiment may include this arrangement.

The light shielding member may be made of the material which is not substantially transparent against the laser light. The light shielding member includes an absorption member and a reflective member. When a metal film is used for the light shielding member 155, it functions as the upper electrode 122.

A thickness of the light shielding member 155 may be thinner than a thickness of the step in the stepped structure 150 in order to diminish light scattering caused by the light shielding member 155.

When the difference of a refractive index between the stepped structure 150 and the light shielding member 155 is less than 20% of the refractive index of the stepped structure 150, the reflectivity between the stepped structure 150 and the light shielding member 155 is less than 1%. For example, the stepped structure 150 may be made of $SiO_2$ and the light shielding member 155 may be made of Al in the surface emitting laser 100 ($\lambda=680$ nm).

(Manufacturing Method)

The following is an example of a manufacturing method of the surface emitting laser 100.

A vertical cavity structure ($\lambda=680$ nm) including a bottom mirror 112 made of n-type semiconductor, an active layer 114, and an upper mirror 116 made of p-type semiconductor. These are formed on GaAs substrate 110 and manufactured by Metal Organic Chemical Vapor Deposition (MOCVD) method.

The bottom mirror 112 and the upper mirror 116 form a multilayer mirror. For example, $Al_{0.9}Ga_{0.1}As$ of $\lambda/4$ and $Al0.5Ga0.5As$ of $\lambda/4$ are stacked alternately, and the bottom mirror 112 and the upper mirror 116 have 70 pairs and 35 pairs, respectively.

The active layer 114 has a multiple-quantum-well structure and a cladding layer. When oscillation wavelength is 680 nm, for example, the multiple-quantum-well structure may be made of GaInP/AlGaInP and the cladding layer may be made of AlGaInP.

For example, a cylindrical mesa structure having 30 μm diameter is formed by etching. After that, a current confinement structure 118 having 5.2 μm diameter may be formed by oxidizing $Al_{0.98}Ga_{0.02}As$ layer located near to the active layer 114 in the upper mirror 116.

A stepped structure 150 is provided on the surface of the upper mirror 116. The stepped structure 150 may be made of semiconductor or dielectric materials. For example, the stepped structure 150 made of $SiO_2$ having refractive index of 1.5 may be deposited by plasma chemical vapor deposition (CVD) or sputtering.

A first region 160 is inside a circle having 3.6 μm diameter and a second region 162 is outside a circle having 5.0 μm diameter. A center of the first region 160 and a center of the second region 162 are substantially same as an optical axis 136 of a light source which is a center of the current confinement structure 118.

A manufacturing method of the stepped structure 150 is as follows.

At first, $SiO_2$ having $1.5\lambda$ optical thickness is deposited and a member corresponding to the second region 162 is etched by wet etching or dry etching. Thus, the taper shaped structure having the inclined edge is formed in the third region 165.

Next, $SiO_2$ having $0.5\lambda$ optical thickness is deposited so as to cover the structure so a member of $2.0\lambda$ optical thickness and a member of $0.5\lambda$ optical thickness may be formed in the first region 160 and the second region 162, respectively. In the process, the tapered shape is maintained and the inclined edge exists in the third region 165.

The following is some other manufacturing method of the stepped structure 150. At first, $SiO_2$ having $0.5\lambda$ optical thickness is deposited and a resist is deposited in the area except the first region 160. Then $SiO_2$ having $1.5\lambda$ optical thickness is deposited and the resist is removed by a liftoff method. In this way, the stepped structure 150 is formed, which has the member of $2.0\lambda$ optical thickness in the first region 160 and the member of $0.5\lambda$ optical thickness in the second region 162.

The light shielding member 155 is formed on the third region 165 by a liftoff method. The light shielding member 155 is formed in the edge portion of the stepped structure as shown in FIG. 1. For example, the light shielding member 155 is metal film (e.g., Au) of 100 nm thickness.

The p-type upper electrode 122, for example, Ti/Au and the n-type bottom electrode 110, for example, AuGe/Au are provided on the upper mirror 116 and on the back side of the substrate 110, respectively.

When the stepped structure 150 is made of semiconductor, the stepped structure 150 may be formed by etching the semiconductor in the second region 162.

When the metal film as the light shielding member 155 is selected from the materials which may contact to the semiconductor of the stepped structured 150 as ohmic contact, the metal film of the light shielding member 155 may be used for the upper electrode 122.

After forming the light shielding member 155, it is possible to form the stepped structure 150 using the light shielding member 155. For example, the photoresist is formed on the light shielding member 155 so as to cover the first region 160. After that, the second region 162 is etched to form the stepped structure 150.

Second Embodiment

Figure 3:
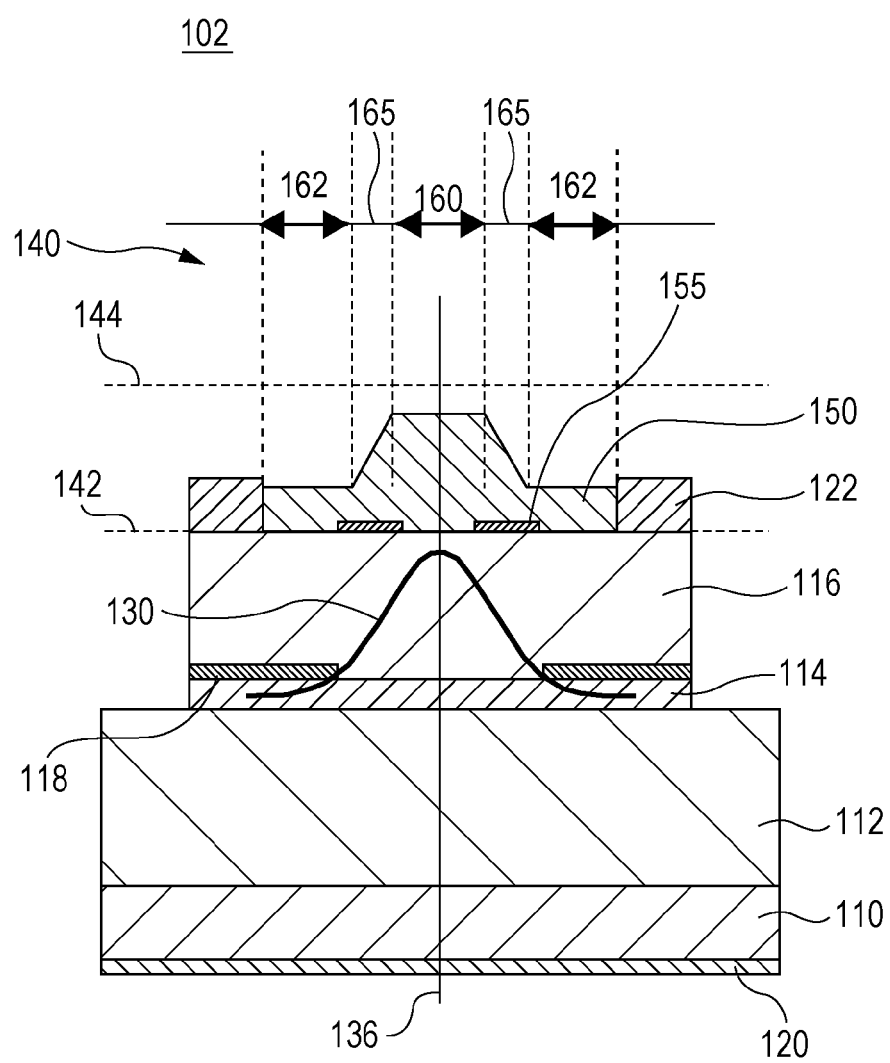
FIG. 3 is a diagram illustrating a sectional view of a surface emitting laser according to a second embodiment.

FIG. 3 is a sectional view of a surface emitting laser 102 according to an embodiment.

In the second embodiment, the stepped structure 150 is formed above the light shielding member 155, which is different from the first embodiment. In this case, the light shielding member 155 is provided in the third region 165 as with the first embodiment.

For example, the light shielding member 155 is a ring-shaped metal having an inner diameter of 3.7 μm and an outer diameter of 5.1 μm. The light shielding member 155 is formed on the upper mirror 116. Its thickness is, for example, 100 μm. The stepped structure 150 made of $SiO_2$ is formed above it.

Because the light shielding member 155 is formed on the upper mirror 116, the light shielding member 155 may be arranged in a horizontal direction. Also, the light shielding member 155 is not exposed due to the stepped structure 150. As a result, the second embodiment may have advantages compared with the first embodiment.

Third Embodiment

The following is an explanation about an image forming apparatus including a surface-emitting-laser array used for a light source. The surface-emitting-laser array light source includes a plurality of surface emitting lasers according to any of the above embodiment.

Figure 6A:
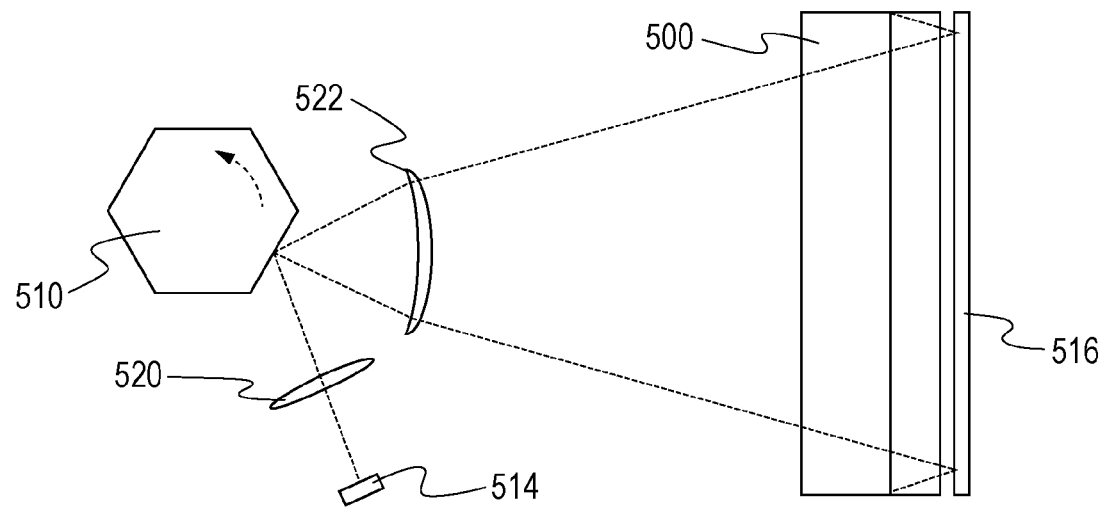
FIG. 6A is a plan view of an image forming apparatus according to a third embodiment.
Figure 6B:
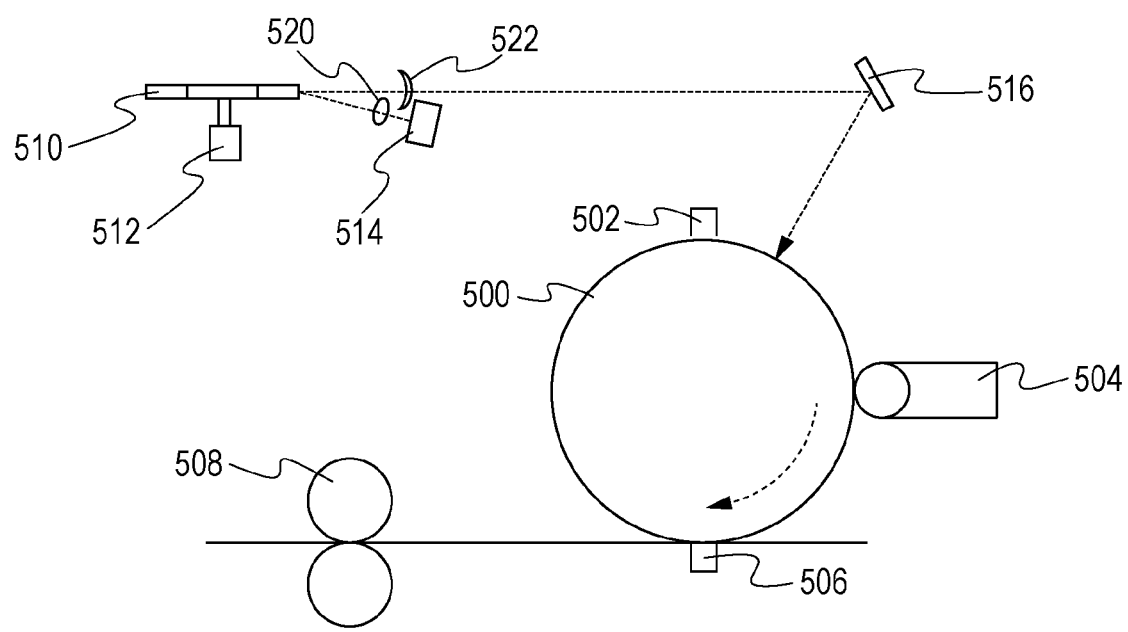
FIG. 6B is a side view of the image forming apparatus according to the third embodiment.

FIG. 6A is a plan view of the image forming apparatus and FIG. 6B is a side view of it.

A laser beam emitted from the surface-emitting-laser-array light source 514, as a recording light source, is transmitted through a collimator lens 520 and travels toward a rotating polygon mirror 510, which is driven to rotate by a motor 512.

The laser beam that strikes the rotating polygon mirror 510 is reflected by the rotating polygon mirror 510. The reflected beam is transmitted through an f-θ lens 522. The beam is reflected by the mirror 516 in such a manner as to fall onto a photosensitive member 500.

The photosensitive member 500 is charged in advance by a charging device 502 and is exposed to the scanningly moved laser beam, whereby an electrostatic latent image is formed thereon. The electrostatic latent image formed on the photosensitive member 500 is developed by a developing device 504 into a visible image. The visible image is transferred to transfer paper by a transfer charging device 506. The transfer paper having the visible image is conveyed to a fixing device 508, where fixing is performed thereon. Subsequently, the paper having the fixed image is discharged to the outside of the apparatus.

Other Embodiment

Figure 4:
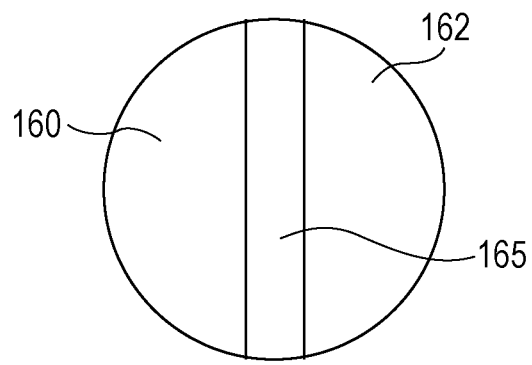
FIG. 4 is a diagram illustrating a top view of the first, second, and third regions in the surface emitting laser according to one embodiment.

FIG. 2 shows that the second region 162 surrounds the first region 160. The embodiments are not limited to this arrangement. For example, as shown in FIG. 4, when the first region 160 and the second region 162 are of semicircular shape, the light shielding member may be arranged in the third region 165. That is, the second region 162 is not provided far from the first region 160 with respect to the center of the emission area.

Figure 5:
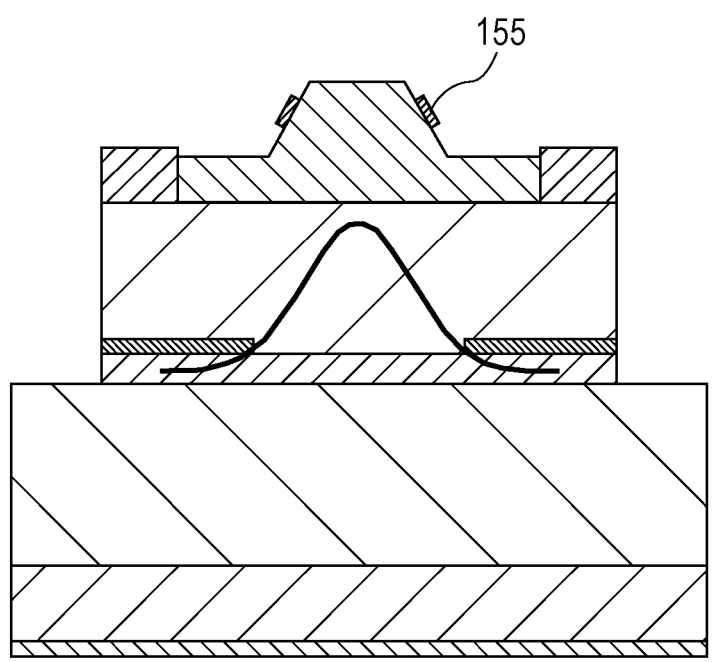
FIG. 5 is a diagram illustrating a sectional view of a surface emitting laser according to one embodiment.

The light shielding member may be provided in not only all of the third region 165 but also a part of the third region 165 as shown in FIG. 5.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. This application claims the benefit of Japanese Patent Application No. 2011-058124, filed Mar. 16, 2011, which is hereby incorporated by reference herein in its entirety.

What is claimed is:

1. A surface emitting laser comprising:
    a substrate;
    a bottom mirror on the substrate;
    an active layer on the bottom mirror;
    an upper mirror on the active layer;
    a stepped structure on the upper mirror having:
        a first part,
        a second part, an optical thickness of second part being different from an optical thickness of the first part, and
        a third part, having an inclined edge, between the first part and the second part; and
    a light shielding member provided in a region corresponding to the inclined edge and not provided in a region corresponding to a portion of the first part and a region corresponding to a portion of the second part.

2. The surface emitting laser according to claim 1, wherein the light shielding member is provided on all of the region corresponding to the third part.

3. The surface emitting laser according to claim 1, wherein the light shielding member is provided on a portion of the region corresponding to the third part.

4. The surface emitting laser according to claim 1, wherein a thickness of the light shielding member is thinner than a difference between a thickness of the second part and a thickness of the first part.

5. The surface emitting laser according to claim 1, wherein the light shielding member is provided on an upper portion of the stepped structure.

6. The surface emitting laser according to claim 1, wherein the light shielding member is provided between the upper minor and the stepped structure.

7. The surface emitting laser according to claim 1, wherein a difference L between the optical thickness of the first part and the optical thickness of the second part satisfies the following expression:

$$(N+\tfrac{1}{4})\lambda < L < (N+\tfrac{3}{4})\lambda$$

where N is an integer.

8. The surface emitting laser according to claim 1, wherein the light shielding member is made of metal material.

9. The surface emitting laser according to claim 1, wherein a difference of a refractive index between the stepped structure and the light shielding member is less than 20% of a refractive index of the stepped structure.

10. An image forming apparatus comprising:
    a surface emitting laser array having a plurality of the surface emitting lasers according to claim 1;

a photosensitive member forming an electrostatic latent image due to a light from the surface emitting laser array;
a unit charging the photosensitive member; and
a unit developing the electrostatic latent image.

11. The surface emitting laser according to claim 1, wherein the second part is provided in at least a portion of region around of the first part.

12. The surface emitting laser according to claim 1, wherein a thickness of the first part is larger than a thickness of the second part.

* * * * *